United States Patent
Tzou et al.

(10) Patent No.: US 8,304,993 B2
(45) Date of Patent: Nov. 6, 2012

(54) SEPARATE LED LAMP TUBE AND LIGHT SOURCE MODULE FORMED THEREFROM

(75) Inventors: Hua-Lung Tzou, Hsin-Chu Hsein (TW); Meng-Chai Wu, Hsin-Chu Hsein (TW)

(73) Assignee: Lextar Electronics Corp., Hsinchu (TW)

( * ) Notice: Subject to any disclaimer, the term of this patent is extended or adjusted under 35 U.S.C. 154(b) by 579 days.

(21) Appl. No.: 12/551,976

(22) Filed: Sep. 1, 2009

(65) Prior Publication Data
US 2010/0201269 A1   Aug. 12, 2010

(30) Foreign Application Priority Data

Feb. 12, 2009 (TW) ............................... 98104466 A

(51) Int. Cl.
*H01J 25/50* (2006.01)
(52) U.S. Cl. ........ 315/51; 315/246; 315/185 R; 362/219
(58) Field of Classification Search ............... 315/51, 315/32, 246, 185 R; 362/217.1, 217.13, 362/219–225
See application file for complete search history.

(56) References Cited

U.S. PATENT DOCUMENTS

| | | | |
|---|---|---|---|
| 6,472,823 B2 * | 10/2002 | Yen | 315/112 |
| 6,659,622 B2 | 12/2003 | Katogi et al. | |
| 7,476,004 B2 * | 1/2009 | Chan | 362/240 |
| 2010/0124054 A1 * | 5/2010 | Chen et al. | 362/221 |
| 2011/0058365 A1 | 3/2011 | Osawa | |

FOREIGN PATENT DOCUMENTS

| | | |
|---|---|---|
| JP | 2002-163907 | 6/2002 |
| JP | 3097580 | 1/2004 |
| JP | 2006-012860 | 1/2006 |
| JP | 3146172 | 11/2008 |
| TW | M323559 | 12/2007 |
| TW | M331078 | 4/2008 |
| TW | M337036 | 7/2008 |
| TW | M349465 | 1/2009 |
| WO | 2009-145248 | 12/2009 |

\* cited by examiner

*Primary Examiner* — James H Cho
(74) *Attorney, Agent, or Firm* — Liu & Liu

(57) ABSTRACT

A lamp tube according to the present invention at least comprises: a tube body, a light-emitting module, a driving module and an electrical connection module. The light-emitting module and the driving module are disposed in the tube body. The light-emitting module is provided with a first circuit board and a plurality of LEDs. The driving module is provided with at least a second circuit board and a drive circuit. The electrical connection module forms an electrical connection between the first and second circuit boards. It is convenient to independently replace or repair the driving module or the light-emitting module without discarding the entire lamp tube so as to effectively save costs and achieve the effects of energy saving and environmental protection.

22 Claims, 14 Drawing Sheets

SEPARATE LED LAMP TUBE AND LIGHT SOURCE MODULE FORMED THEREFROM

BACKGROUND OF THE INVENTION (a) Field of the Invention

The present invention relates to a separate LED lamp tube, and more particularly to a separate LED lamp tube whose driving module or light-emitting module can be independently replaced or repaired and a light source module formed therefrom.

(b) Description of the Prior Art

With the continuing development and progress of science and technology, electronic products and electronic components more and more tend to be lightweight and compact. The foregoing electronic components, such as light-emitting diodes (LEDs), have been gradually applied to lighting equipment because they have the advantages of compactness, power saving, long life, environmental friendliness, and so forth. Although the predicament of insufficient light-emitting luminance has once appeared in the early stage of the development of LEDs, the breakthrough on materials and technologies in recent years has significantly improved and increased the luminous efficiency of LEDs, even comparable to the luminance of traditional lighting equipment. Hence, they gradually tend to substitute current lighting equipment.

Conventionally, a LED lamp tube that uses LEDs as lighting equipment, as shown in FIG. 1, mainly comprises: a tube body 11, a light-emitting module 12, a drive circuit 13 and two electrical contacts 14. The light-emitting module 12 is accommodated within the tube body 11. The light-emitting module 12 comprises a circuit board 121 and a plurality of LED lamps 122. The LED lamps 122 are disposed on and electrically connected to the circuit board 121. The drive circuit 13 is accommodated within the tube body 11 and located on the circuit board 121. The drive circuit 13 is electrically connected to the circuit board 121 by soldering. The two electrical contacts 14 are respectively sealably coupled to the both ends of the tube body 11. The two electrical contacts 14 are also respectively electrically connected to the drive circuit 13 by soldering. Thus, the LED lamp tube is formed.

However, a prior art lamp tube still has the following shortcoming impractical use. The service life of the drive circuit 13 is generally about 20,000 hours and that of the LED lamps 122 is about 50,000 hours. Therefore, the drive circuit 13 is liable to be damaged earlier than the LED lamps 122 after the LED lamp tube has been used for a long time. Furthermore, the drive circuit 13 is permanently electrically connected to the circuit board 121 of the light-emitting module 12 by soldering, and the two electrical contacts 14 are respectively sealably coupled to the both ends of the tube body 11. As a result, when the drive circuit 13 is damaged, it is impossible to simply replace or repair the drive circuit 13. The entire LED lamp tube must be discarded. This would cause unnecessary cost consumption.

SUMMARY OF INVENTION

In view of the above-mentioned circumstances, a primary objective of the present invention is to solve the above shortcoming, and the present invention relates to a separate LED lamp tube whose driving module or light-emitting module can be independently replaced or repaired.

To achieve the foregoing objective, a lamp tube according to the present invention at least comprises: a tube body, a light-emitting module, a driving module and an electrical connection module. The light-emitting module and the driving module are disposed in the tube body. The light-emitting module is provided with a first circuit board and a plurality of LEDs disposed on the first circuit board. The driving module is provided with at least a second circuit board and a drive circuit disposed on the second circuit board. The electrical connection module is disposed between the first and second circuit boards. Not only can the electrical connection module form an electrical connection between the first and second circuit boards, but it is also convenient to independently replace or repair the driving module or the light-emitting module without discarding the entire lamp tube so as to effectively save costs and achieve the effects of energy saving and environmental protection.

DETAILED DESCRIPTION OF T PREFERRED EMBODIMENTS

Figure 1:
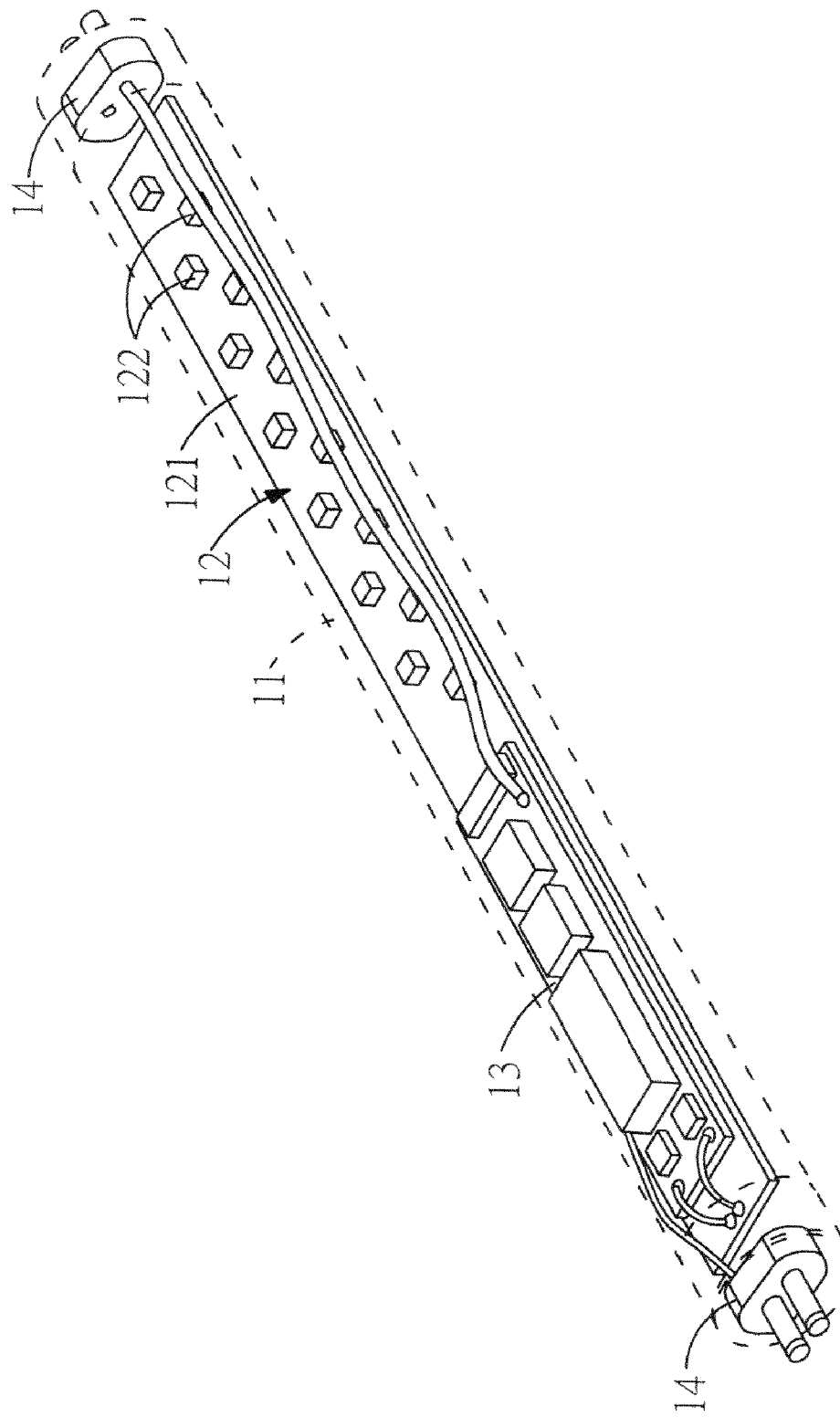
FIG. 1 is a schematic view showing a structure of a LED lamp tube of the prior art.
Figure 2:
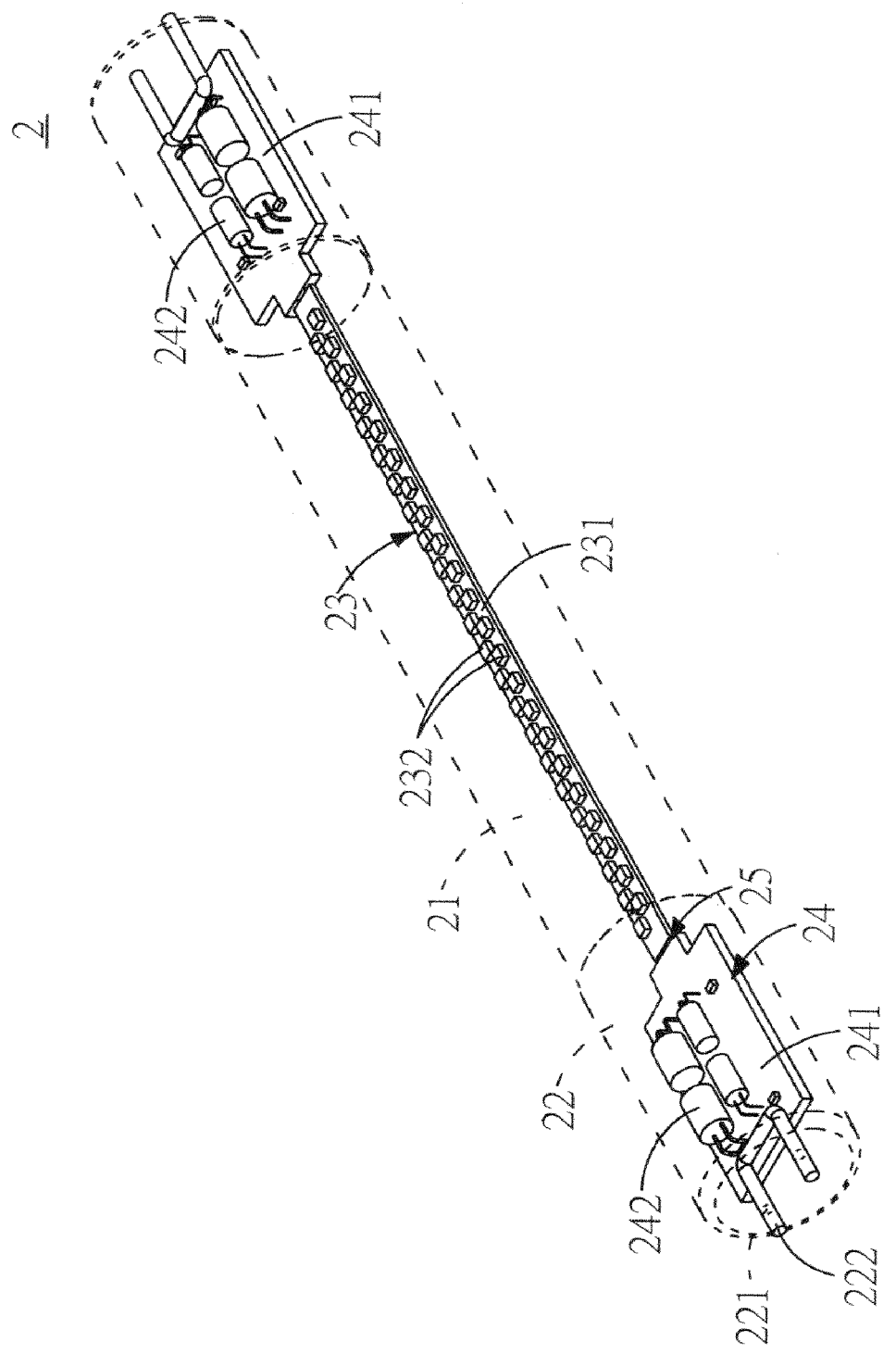
FIG. 2 is a three-dimensional view showing a structure of a lamp tube according to a first embodiment of the present invention.

A lamp tube 2 according to the present invention, as shown in the first embodiment of FIG. 2, at least comprises:

a tube body 21, which can be a light transparent hollow tube body that is assembled on at least one end thereof with a fixed cover 22 being provided thereon with through holes 221 such that electrical connection terminals 222 being fixed and exposed;

a light-emitting module 23, which is disposed in the tube body 21 and is provided with a first circuit board 231 and a plurality of LEDs 232 disposed on the first circuit board 231;

a driving module 24, which is disposed in the tube body 21 and is provided with at least a second circuit board 241 and a drive circuit 242 disposed on the second circuit board 241, as shown in the embodiment of this figure, two of the second circuit boards 241 being respectively disposed in the fixed covers 22; and electrical connection modules 25, each of which is disposed between the first and second circuit boards 231, 241 and forms an electrical connection between the first and second circuit boards 231, 241.

Figure 3:
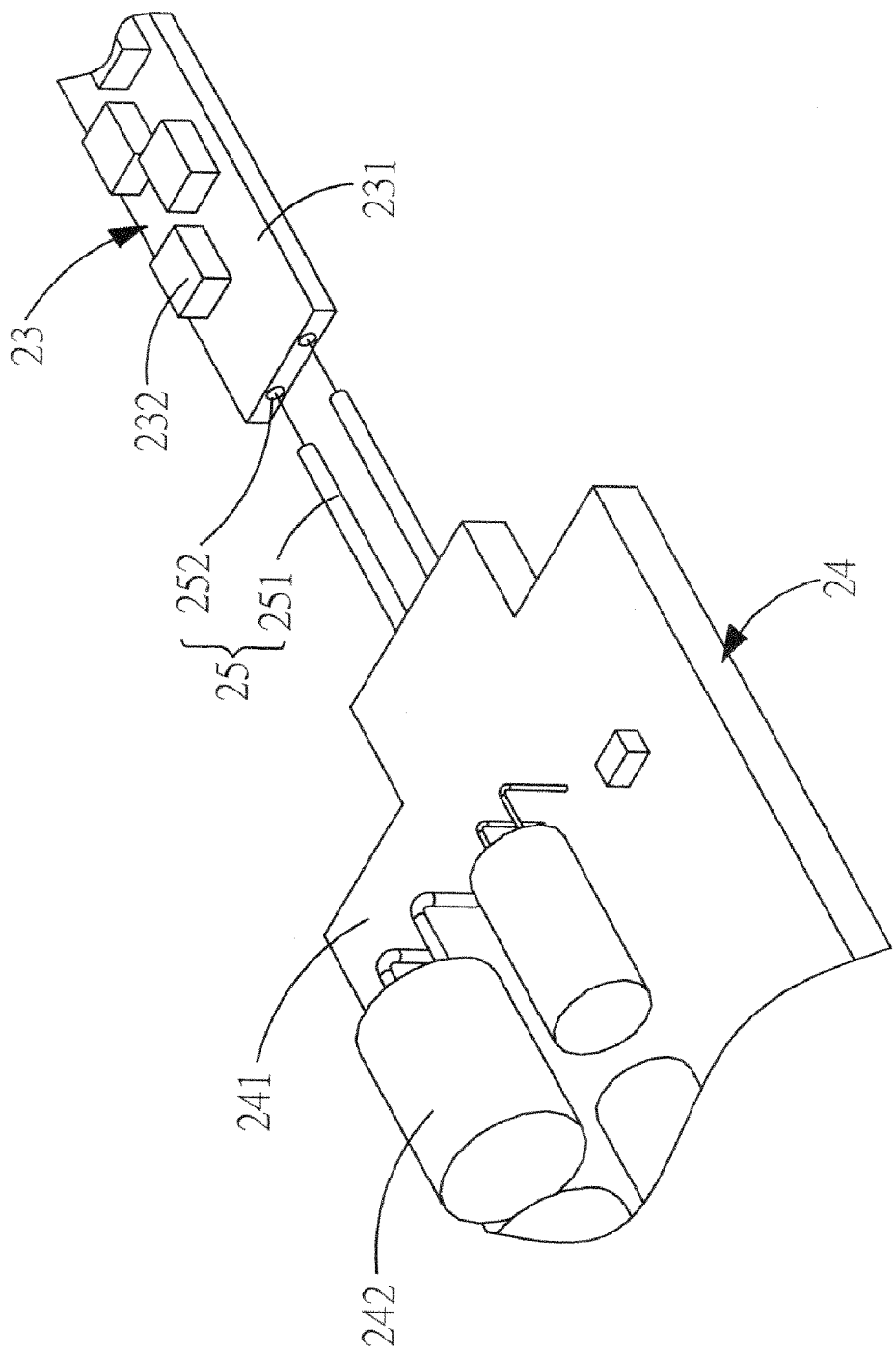
FIG. 3 is an exploded view showing a structure connecting a light-emitting module and a driving module according to a first embodiment of the present invention.

In assembling the entire lamp tube, the fixed covers 22 are assembled and fixed on the both sides of the tube body 21 and the second circuit boards 241 are respectively assembled on the two sides of the first circuit board 231 by means of the electrical connection modules 25. Also referring to FIG. 3, the electrical connection module 25 can be comprised of electrically conductive terminals 251 and electrically conductive holes 252 that are respectively disposed on the first and second circuit boards 231, 241 and are mutually insertable. The electrically conductive terminals 251 can be disposed on the driving module 24 and they are disposed on the second circuit board 241 in this figure. The electrically conductive holes 252 are disposed on the light-emitting module 23 and they are disposed on the first circuit board 231 in this figure (or the electrically conductive terminals can be disposed on the light-emitting module and the electrically conductive holes are disposed on the driving module) An electrical connection is formed between the light-emitting module 23 and the driving module 24 by inserting the electrically conductive terminals 251 into the electrically conductive holes 252. Electrical connections are formed between the electrical connection terminals 222 and the second circuit board 241 (in the embodiment of this figure, the electrical connection terminals 222 are directly soldered to the second circuit board 241). The electrical connection terminals 222 and the driving module 24 are shielded and protected by the fixed cover 22, which can be of an opaque material. When the entire lamp tube 2 is assembled on a lamp holder and connected to an external power source, the electrical connection terminals 222 transmit the power to the driving module 24. The driving module 24 rectifies the current (for example, AC/DC or DC/DC) and then transmits the rectified current to the light-emitting module 23 such that each of the LEDs 232 emits light to achieve the effect of illumination. When the light-emitting module or the drive circuit on one of the second circuit boards needs to be repaired or replaced, it is only necessary to separate the fixed cover form the tube body. In the meantime, the first circuit board of the light-emitting module is separated from the second circuit board. Thus, the driving module or the light-emitting module can be independently replaced or repaired without discarding the entire lamp tube.

Figure 4:
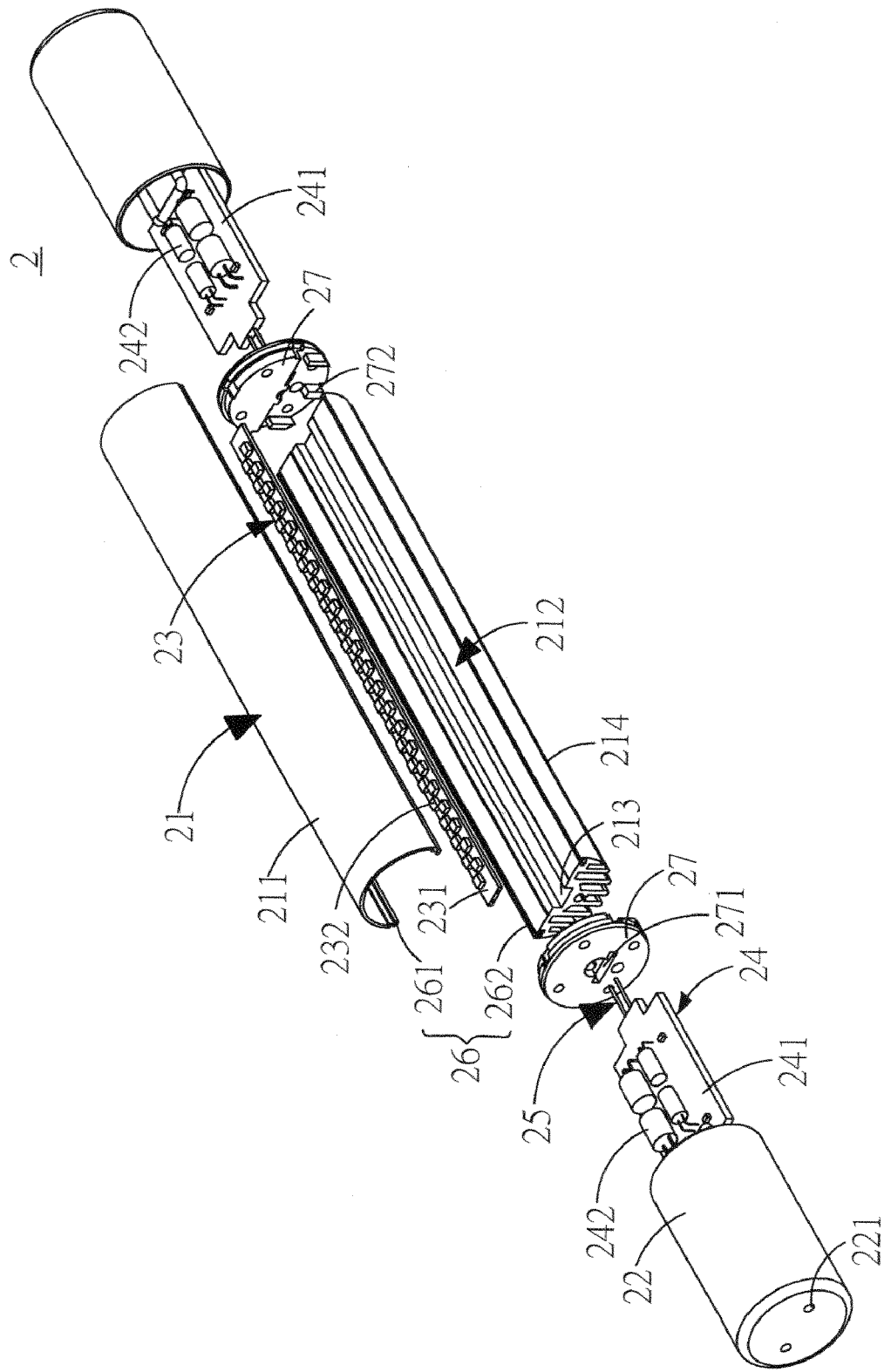
FIG. 4 is an exploded view showing a structure of a lamp tube according to a second embodiment of the present invention.
Figure 5:
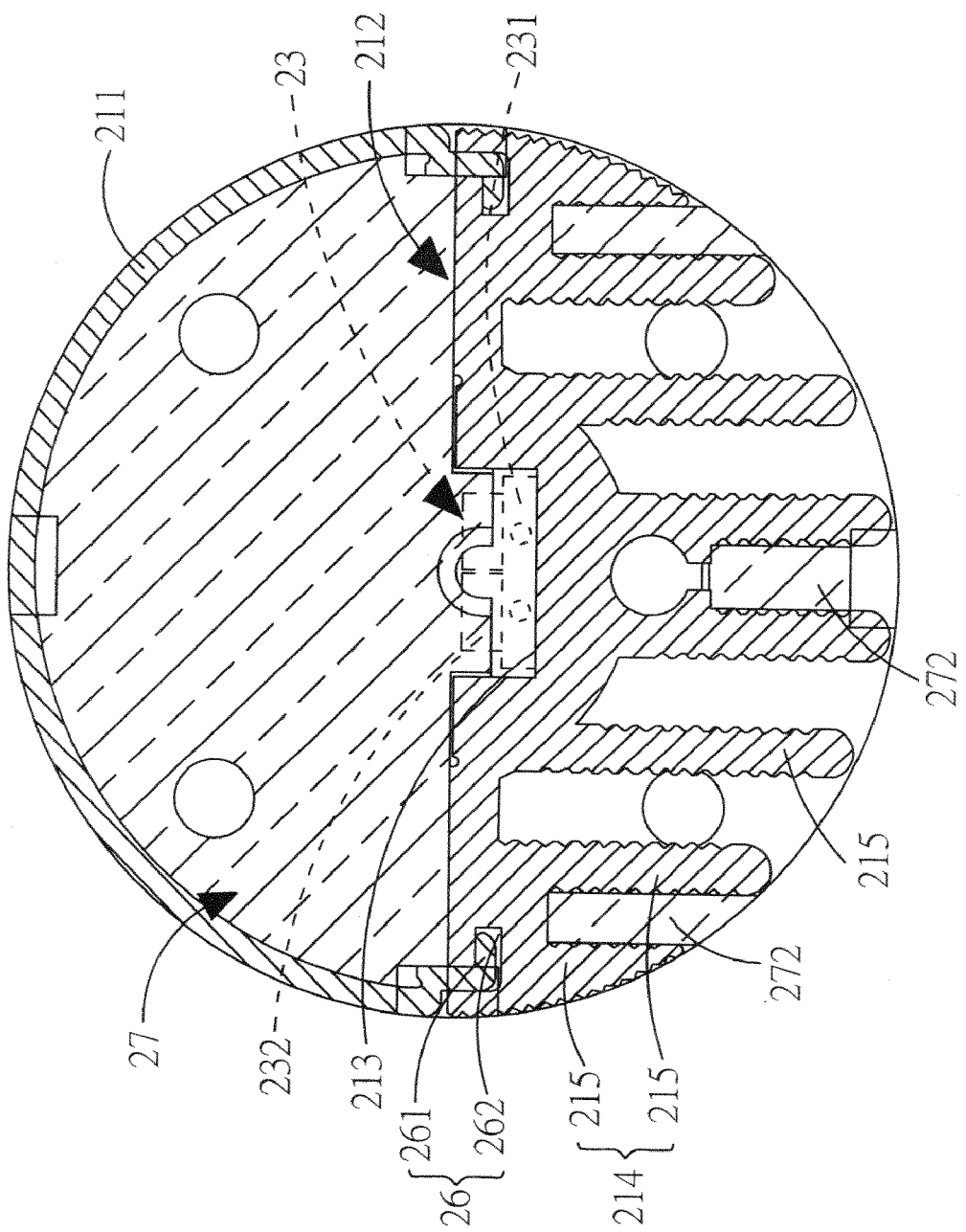
FIG. 5 is a schematic view showing a partial structure of a lamp tube according to a second embodiment of the present invention.

FIGS. 4 and 5 show the second embodiment of the present invention. The lamp tube is similarly provided with: a tube body 21, a light-emitting module 23, a driving module 24 and electrical connection modules 25. The tube body 21 is provided with a light transparent body 211 and a supporting body 212 which are assembled with each other. A fastening means 26 is disposed between the light transparent body 211 and the supporting body 212. The fastening means 26 can be a projection 261 and a rail 262 that are mutually engageable. The projection 261 is disposed on the light transparent body 211 and the rail 262 is disposed on the supporting body 212 (or the projection is disposed on the supporting body and the rail is disposed on the light transparent body). The light transparent body 211 and the supporting body 212 can be assembled with each other by the engagement of the projection 261 with the rail 262. The supporting body 212 can be provided with a placement portion 213 and a heat sink 214 disposed under the placement portion 213. The light-emitting module 23 is disposed on the placement portion 213. The heat sink 214 is provided with a plurality of spaced cooling fins 215 for dissipating the heat from the operating light-emitting module 23.

Figure 6:
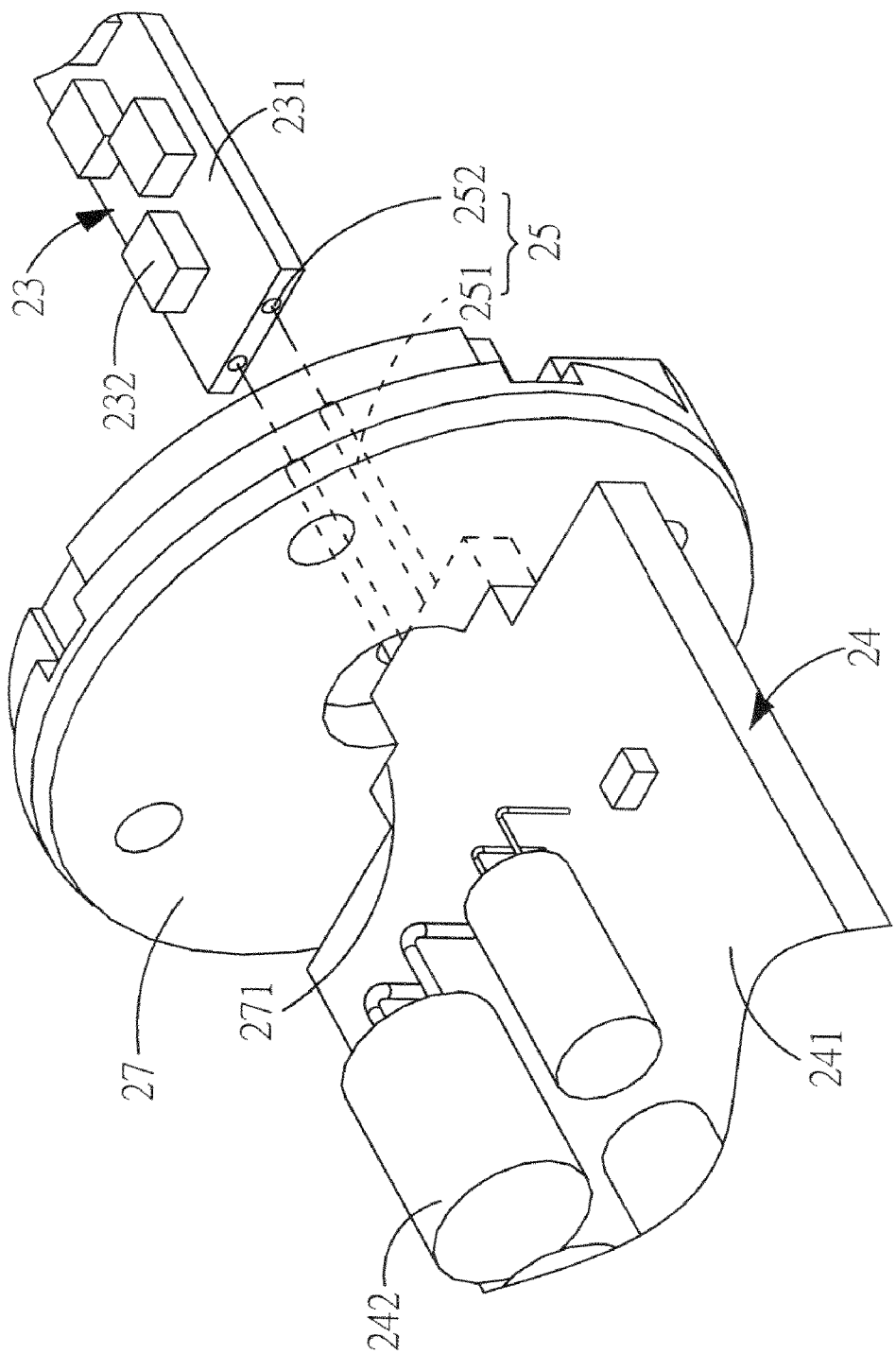
FIG. 6 is an exploded view showing structures of a light-emitting module, a driving module and a connecting member according to a second embodiment of the present invention.
Figure 7:
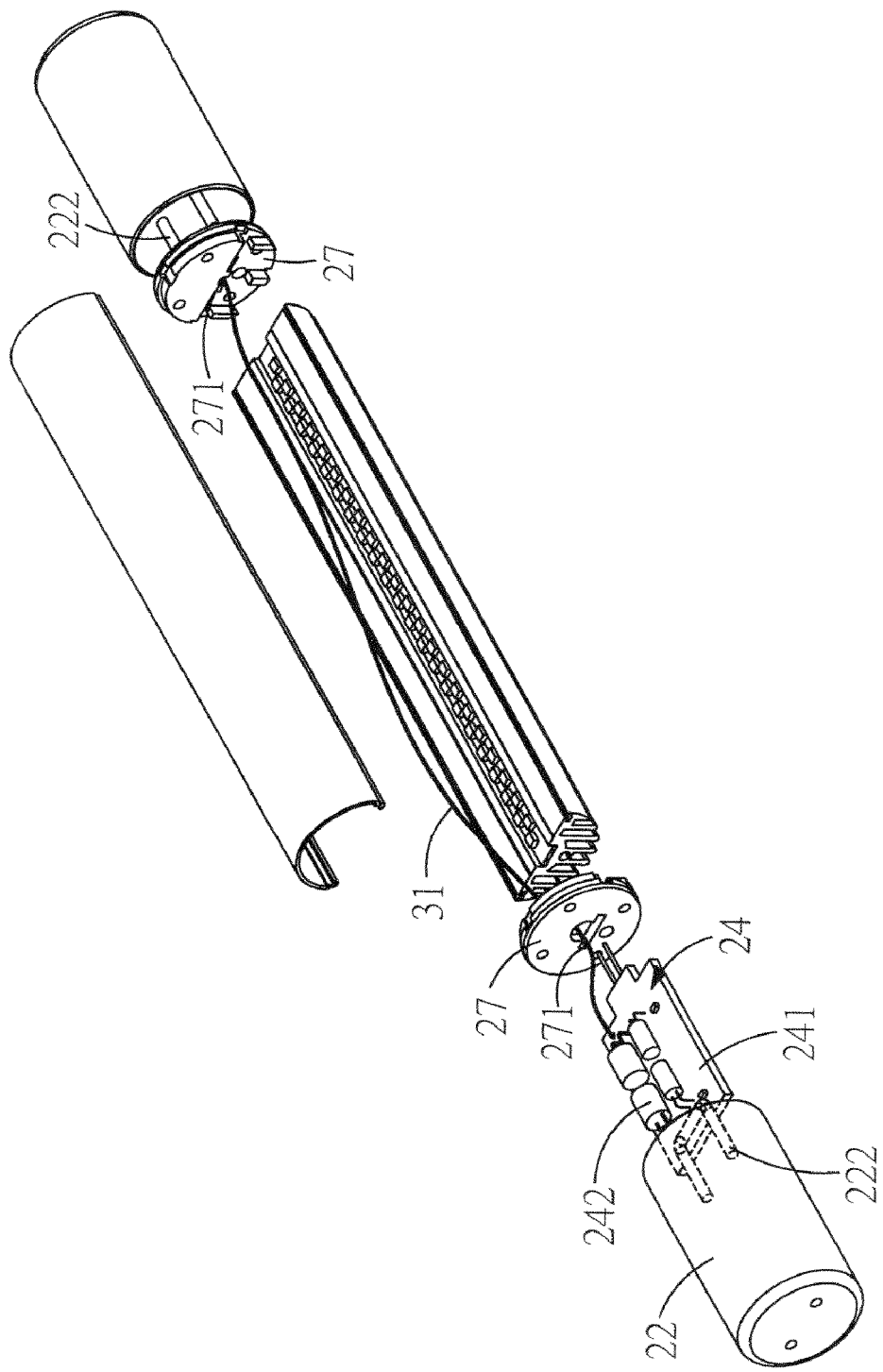
FIG. 7 is an exploded view showing a structure of a lamp tube according to a third embodiment of the present invention.

Moreover, a connecting member 27 can be further disposed between the tube body 21 and the fixed cover 22. Also referring to FIG. 6, the connecting member 27 is provided with a through hole 271 for the passage of the electrical connection module 25. When the lamp tube of this embodiment is assembled, the light-emitting module 23 is disposed on the placement portion 213 of the supporting body. The light-emitting surface of each of the LEDs 232 is toward the light transparent body 211. The light transparent body 211 and the supporting body 212 are assembled with each other by means of the fastening means 26. The tube body 21 is assembled and positioned with the fixed covers 22 on its both ends respectively by means of the connecting members 27. The connecting member 27 is further provided with nubs 272, each of which can be caught in the space between two of the cooling fins 215 to improve the assembling strength between each assembly. The electrical connections between the light-emitting module 23, the driving module 24 and the electrical connection terminals 222 are the same as those in the first embodiment. It is understood that the driving module 24 can be provided with two of the second circuit boards 241, and can also be provided with one of the second circuit board 241 as shown in the third embodiment of FIG. 7. The second circuit board 241 is similarly assembled on one side of the first circuit board 231 by means of the electrical connection module 25. The electrical connection terminals 222 on one side of the first circuit board are directly soldered to the second circuit board 241, and the electrical connection terminals 222 on the other side of the first circuit board are connected to the second circuit board 241 via a power supply line 31.

Figure 8:
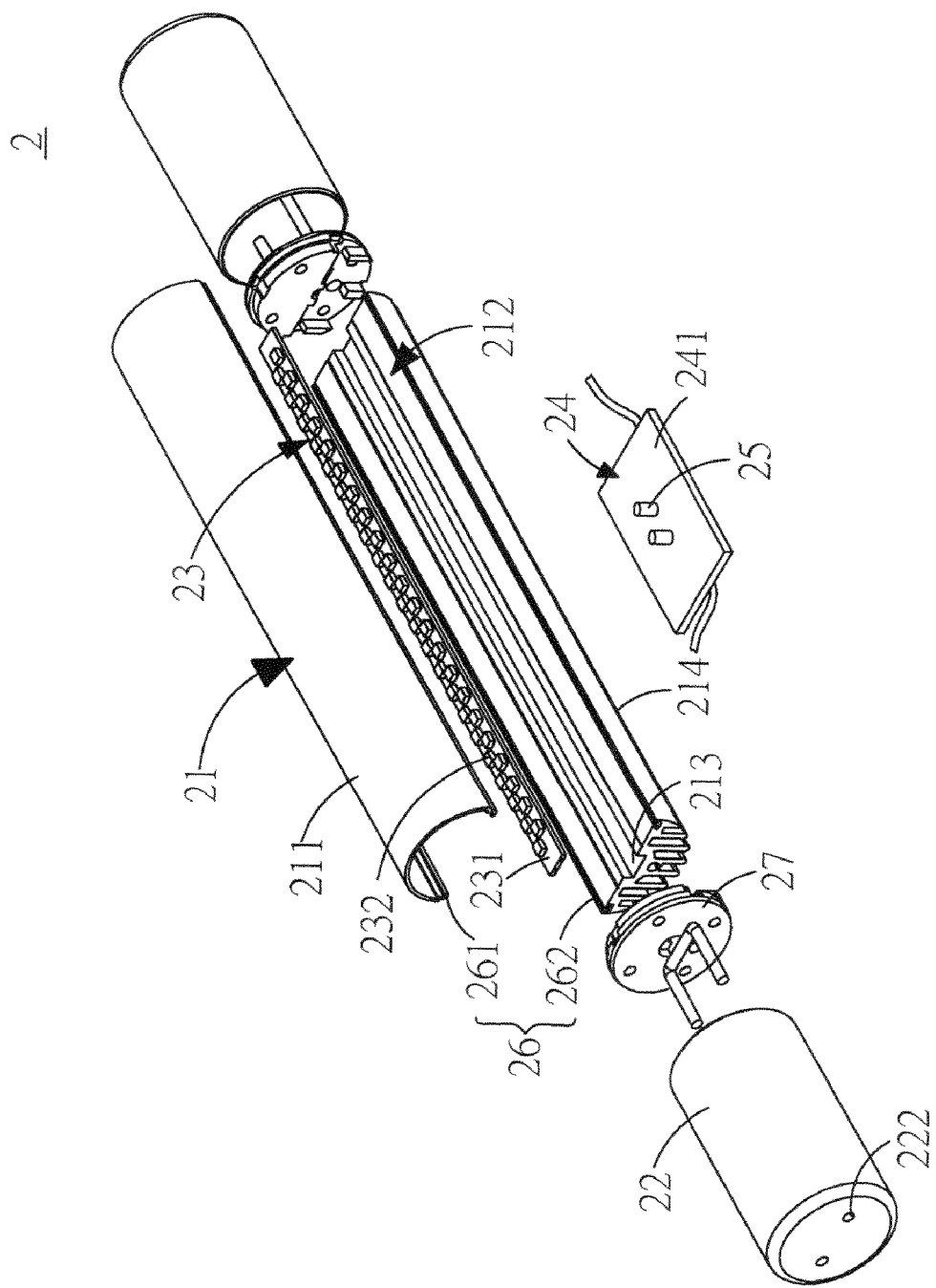
FIG. 8 is an exploded view showing a structure of a lamp tube according to a fourth embodiment of the present invention.

FIG. 8 shows the fourth embodiment of the present invention. The lamp tube is similarly provided with: a tube body 21, a light-emitting module 23, a driving module 24 and an electrical connection module 25. The tube body 21 is provided with a light transparent body 211 and a supporting body 212 which are assembled with each other by means of a fastening means 26. The supporting body 212 can be provided with a placement portion 213 and a heat sink 214 disposed under the placement portion 213. The driving module 24 is disposed on the heat sink 214. The driving module 24 is merely provided with a second circuit board 241. The heat sink 214 is provided with a recess 216 for accommodating the second circuit board 241. Also referring to FIG. 9, the second circuit board 241 is disposed under the first circuit board 231. It is understood that the heat sink 214 is provided with a plurality of spaced cooling fins 215 so the second circuit board 241 is caught in the space between two of the cooling fins 215, as shown in the fifth embodiment of FIG. 10.

Figure 9:
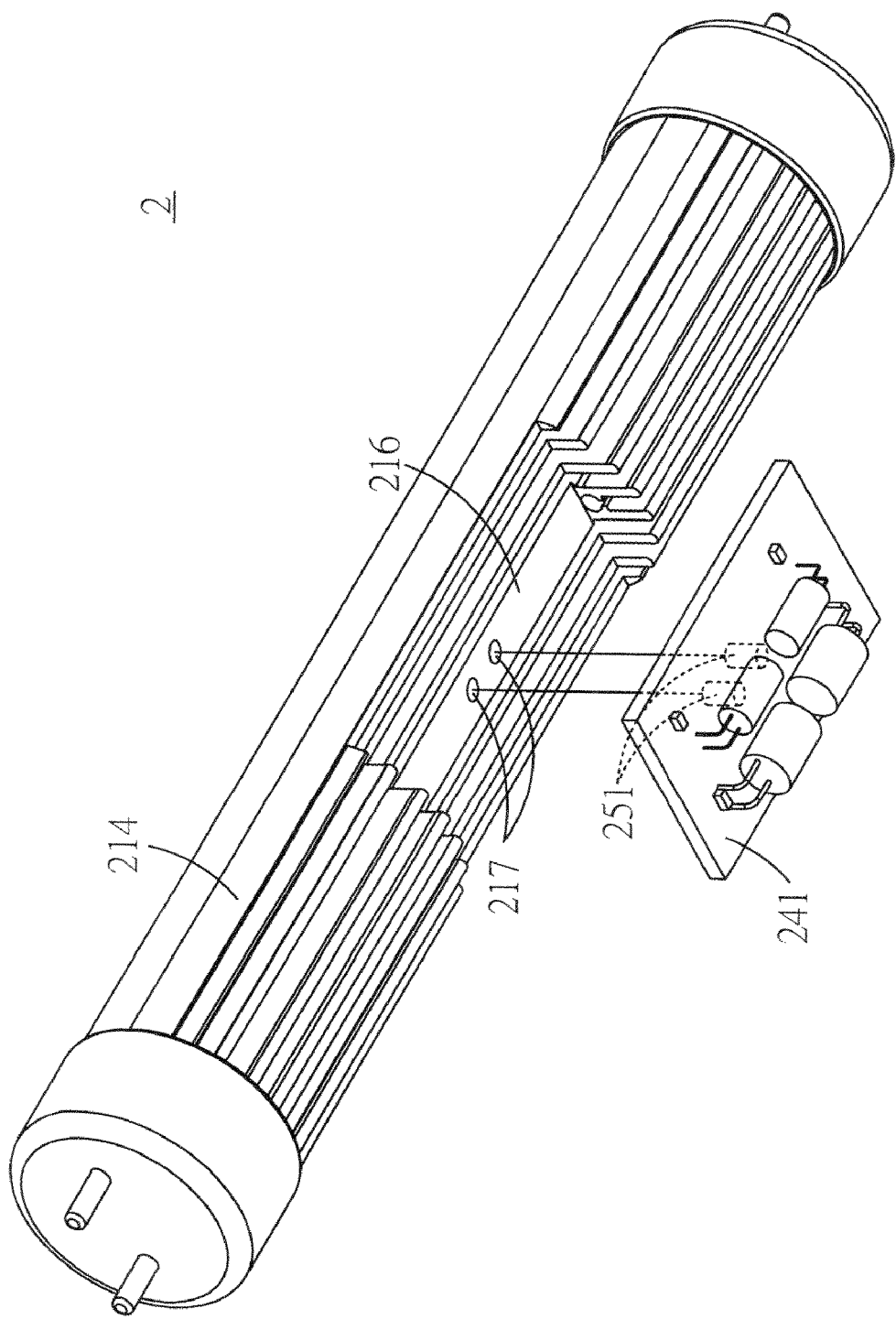
FIG. 9 is an exploded view showing a structure of a lamp tube according to a fourth embodiment of the present invention but viewed from another viewing angle.
Figure 10:
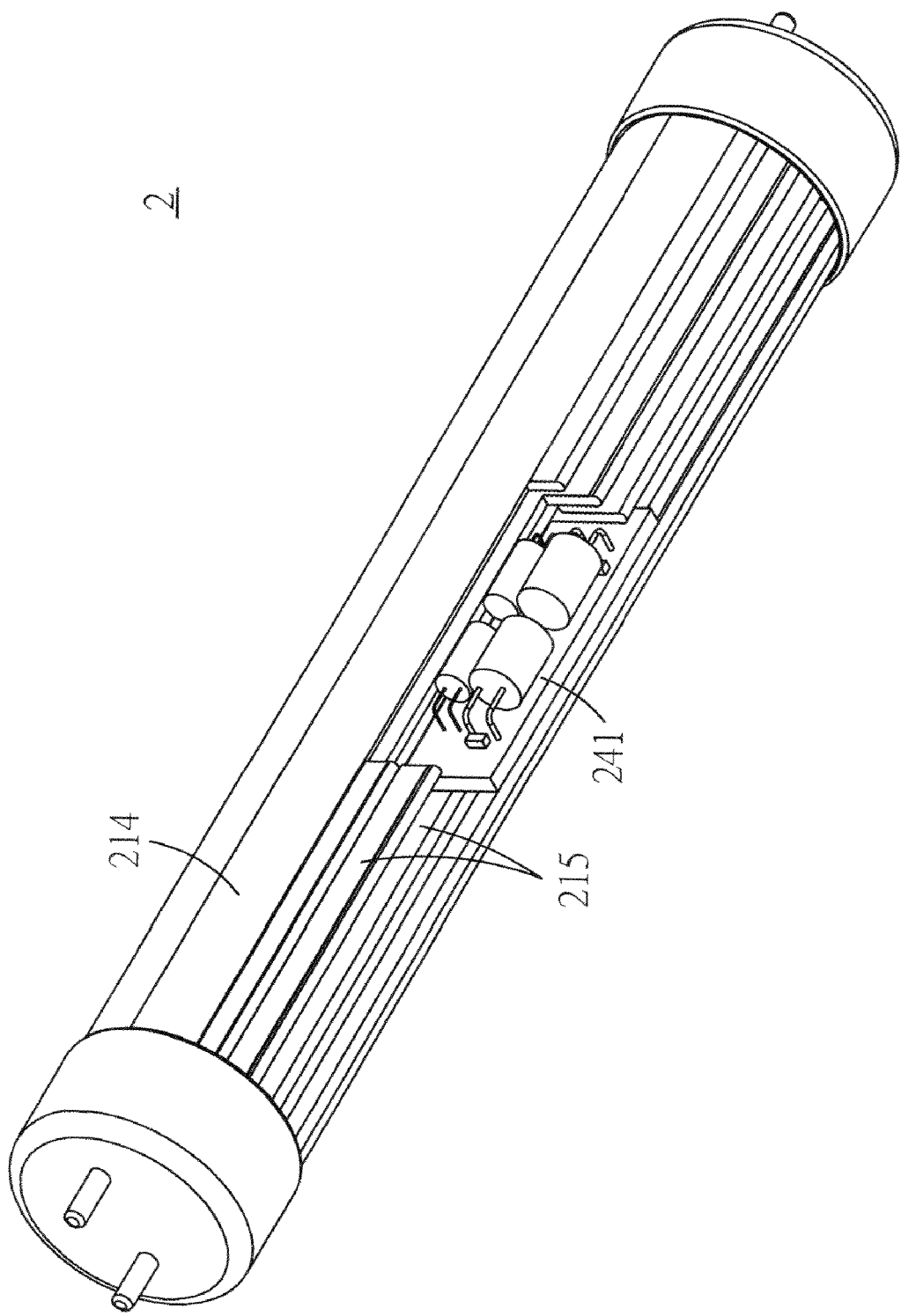
FIG. 10 is a three-dimensional view showing a structure of a lamp tube according to a fifth embodiment of the present invention.
Figure 11:
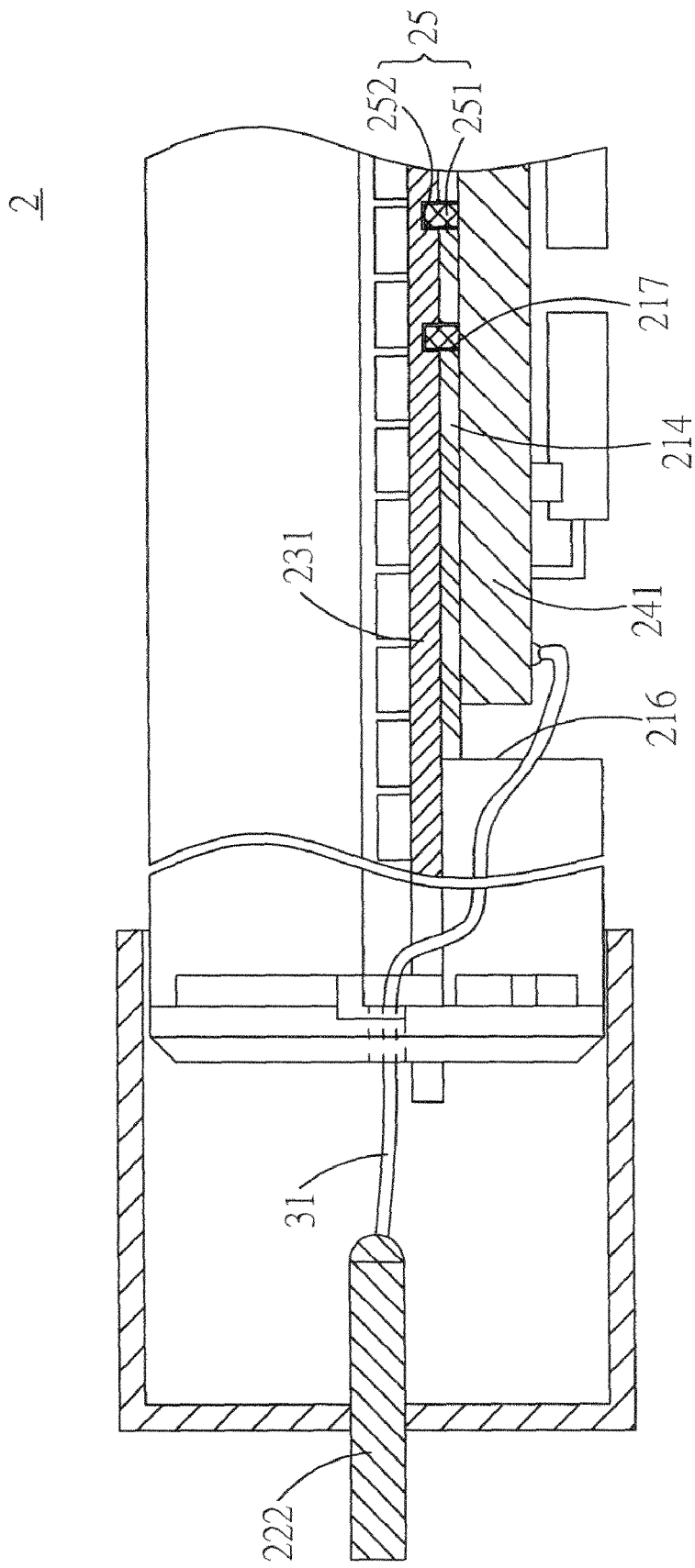
FIG. 11 is a schematic view showing a partial structure of a lamp tube according to a fourth embodiment of the present invention.

The assembling manners in the fourth and fifth embodiments are similar to that in the second embodiment. The light transparent body 211 of the tube body and a supporting body 212 are assembled and positioned with each other similarly by means of a fastening means 26. The tube body 21 and the fixed covers 22 are assembled and positioned with each other by means of the connecting members 27. The difference lies in: the electrical connection module 25 passes through and is disposed in the through holes 217 preset in the heat sink 214, as shown in FIGS. 9 and 11 (the fourth embodiment taken as an example). The electrically conductive terminals 251 of the electrical connection module can be disposed on the second circuit board 241 of the driving module, and the electrically conductive holes 252 are disposed on the first circuit board 231 of the light-emitting module (or the electrically conductive terminals can be disposed on the light-emitting module, and the electrically conductive holes are disposed on the driving module). The electrically conductive terminals 251 pass through the through holes 217 of the heat sink and are inserted into the electrically conductive holes 252 so as to form an electrical connection between the driving module 24 and the light-emitting module 23. The driving module 24 is connected to the electrical connection terminals 222 within the fixed covers on the both sides via power supply lines 31 to form the structure of the entire lamp tube.

Figure 12:
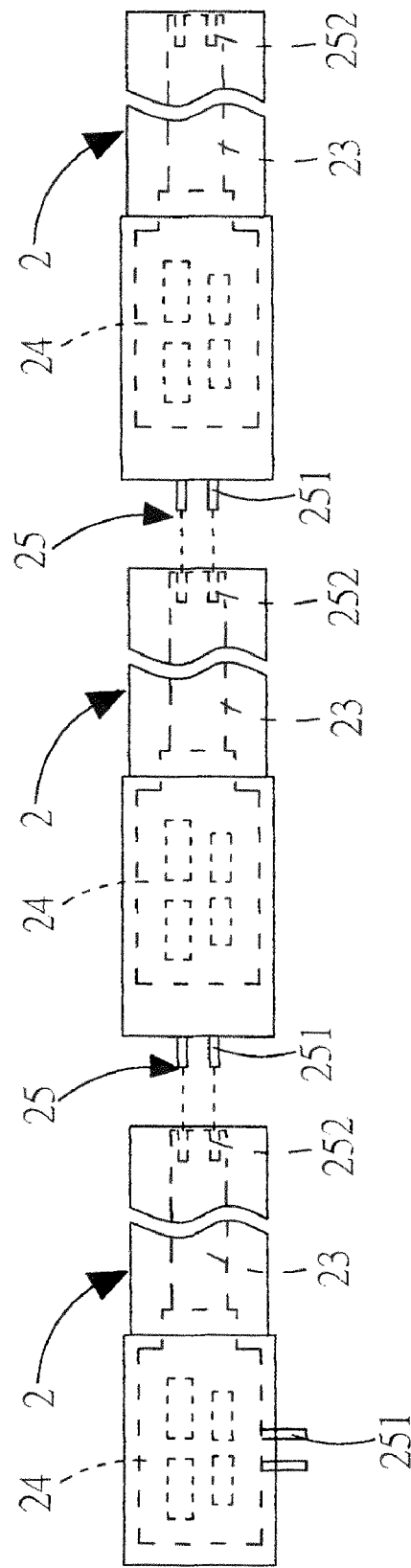
FIG. 12 is a schematic view showing a structure of a first embodiment of a cascade of plural lamp tubes according to the present invention.
Figure 13:
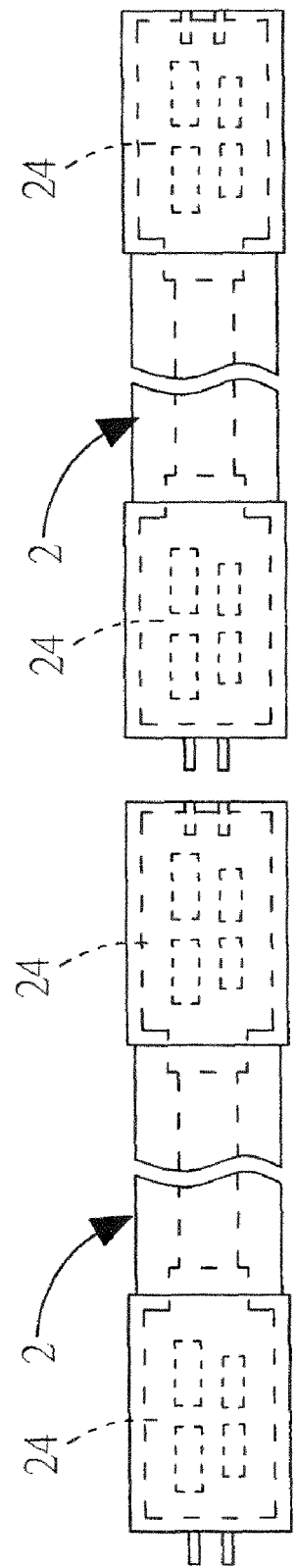
FIG. 13 is a schematic view showing a structure of a second embodiment of a cascade of plural lamp tubes according to the present invention.

Moreover, the lamp tubes described in each above embodiment may be arranged in different combinations. As shown in the first embodiment of FIG. 12, the lamp tube 2 is further provided with another electrical connection module 25. The electrical connection module 25 similarly comprises electrically conductive terminals 251 and electrically conductive holes 252 that are respectively disposed on the both sides of the lamp tube 2. In the embodiment shown in this figure, the electrically conductive holes 252 are disposed on the light-emitting module 23 and the electrically conductive terminals 251 are disposed on the driving module 24. At least two sets or more than two sets of lamp tubes 2 can be further cascaded with each other by means of the electrical connection modules 25 to form a light source module. The electrically conductive terminals 251 or the electrically conductive holes 252 can be respectively formed on the vertical planes of the lamp tubes 2 such that the lamp tubes 2 can be assembled in different manners according to the desired angles. Of course, in all the above embodiments, a driving module 24 is provided on each of the opposite sides of the lamp tube 2. As shown in the second embodiment of FIG. 13, the both sides of the lamp tube 2 are similarly provided with electrically conductive terminals 251 and electrically conductive holes 252 such that a plurality of lamp tubes 2 can be cascaded with each other to form a light source module.

Figure 14:
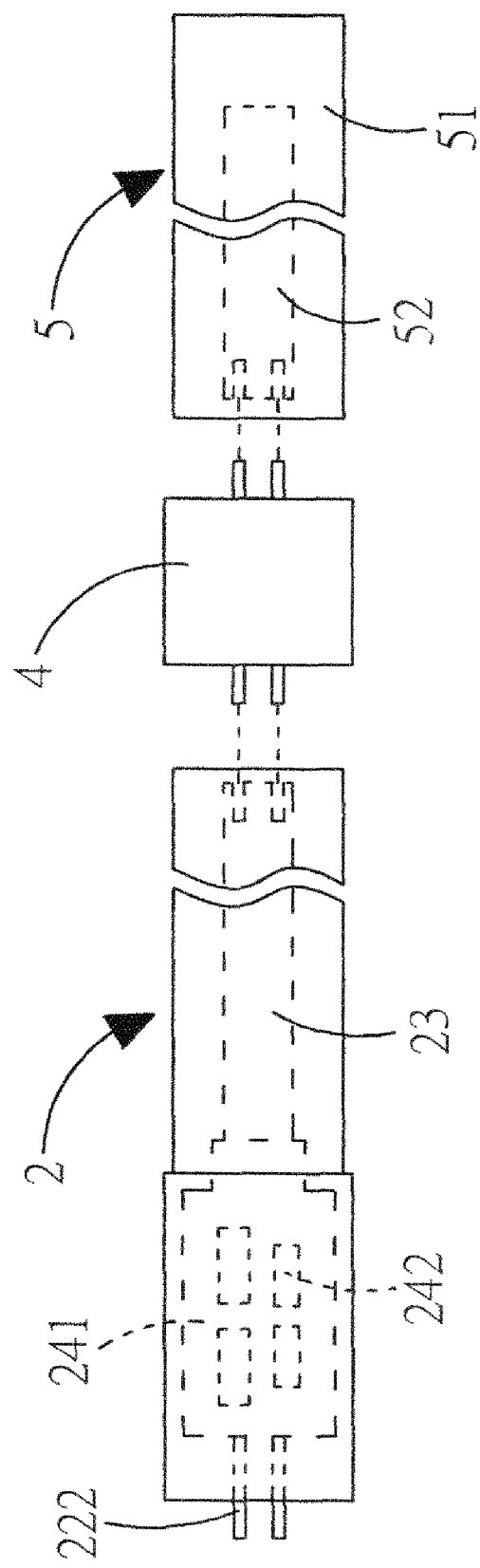
FIG. 14 is a schematic view showing a structure of a third embodiment of a cascade of plural lamp tubes according to the present invention.

The lamp tube 2 can be further cascaded with at least one light-emitting assembly 5 by means of an electrical connection member 4, as shown in the third embodiment of FIG. 14. The light-emitting assembly 5 is provided with a tube body 51 and a light-emitting module 52 such that the light-emitting module 23 in the lamp tube and the light-emitting module 52 in the light-emitting assembly can share the drive circuit 242 on one of the second circuit board 241.

It deserves to be mentioned that a driving module and a light-emitting module permanently assembled in a prior art lamp tube are manufactured in a separately mountable and demountable manner according to the present invention. This allows the user to independently replace or repair the driving module or the light-emitting module without discarding the entire lamp tube so as to effectively save costs and achieve the effects of energy saving and environmental protection.

As mentioned above, the present invention provides an improved separate LED lamp tube, and the application for a patent is duly filed accordingly. However, the foregoing description and drawings show only preferred embodiments of the present invention, and are not used to limit the present invention; and that any construction, installation, or characteristics that is same or similar to that of the present invention should fall within the scope of the purposes and claims of the present invention.

What is claimed is:

1. A separate LED lamp tube at least comprising:
    a tube body;
    a light-emitting module, which is disposed in the tube body and is provided with a first circuit board and a plurality of LEDs disposed on the first circuit board, wherein the tube body is provided with a light transparent body and a supporting body which are assembled with each other, a fastening means is disposed between the light transparent body and the supporting body, and the fastening means is a projection and a rail that are mutually engageable;
    a driving module, which is disposed in the tube body and is provided with at least a second circuit board and a drive circuit disposed on the second circuit board; and
    an electrical connection module, which is disposed between the first and second circuit boards and forms an electrical connection between the first and second circuit boards.

2. The separate LED lamp tube according to claim 1, wherein the tube body is a light transparent hollow tube body and is provided respectively at the both ends thereof with fixed covers which are provided thereon with through holes such that electrical connection terminals are fixed and exposed, and the electrical connection terminals are electrically connected to the second circuit board.

3. The separate LED lamp tube according to claim 1, wherein the supporting body is provided with a placement portion and a heat sink disposed under the placement portion, the light-emitting module is disposed on the placement portion, the light-emitting surface of each of the LEDs is toward the light transparent body, and the heat sink is provided with a recess for accommodating the second circuit board which is disposed under the first circuit board.

4. The separate LED lamp tube according to claim 3, wherein the tube body is provided respectively at the both ends thereof with fixed covers which are provided thereon with through holes such that electrical connection terminals are fixed and exposed, and the electrical connection terminals are electrically connected to the second circuit board.

5. The separate LED lamp tube according to claim 4, wherein a connecting member is further disposed between the tube body and the fixed cover and is provided with a through hole for the passage of the electrical connection module.

6. The separate LED lamp tube according to claim 5, wherein the heat sink is provided with a plurality of spaced cooling fins and the connecting member is provided with nubs, each of which can be caught in the space between two of the cooling fins.

7. The separate LED lamp tube according to claim 1, wherein the electrical connection module is comprised of electrically conductive terminals and electrically conductive holes that are respectively disposed on the first and second circuit boards and are mutually insertable.

8. The separate LED lamp tube according to claim 1, wherein the driving module is provided with one to two of the second circuit boards, which are respectively assembled on the sides of the first circuit board by means of the electrical connection modules.

9. The separate LED lamp tube according to claim 8, wherein the lamp tube is further cascaded with at least one light-emitting assembly by means of an electrical connection member and the light-emitting assembly is provided with a tube body and a light-emitting module.

10. A separate LED lamp tube at least comprising:

a tube body, which is provided with a light transparent body that is assembled on at least one end thereof with a fixed cover, wherein the tube body is further provided with a supporting body, a fastening means is disposed between the light transparent body and the supporting body, and the fastening means is a projection and a rail that are mutually engageable;

a light-emitting module, which is disposed in the light transparent body of the tube body and is provided with a first circuit board and a plurality of LEDs disposed on the first circuit board;

a driving module, which is provided with at least a second circuit board and a drive circuit disposed on the second circuit board that is disposed in the fixed cover of the tube body; and an electrical connection module, which is disposed between the first and second circuit boards and forms an electrical connection between the first and second circuit boards.

11. The separate LED lamp tube according to claim 10, wherein the fixed cover is provided thereon with a through hole such that electrical connection terminals are fixed and exposed, and the electrical connection terminals are electrically connected to the second circuit board.

12. The separate LED lamp tube according to claim 10, wherein the supporting body is provided with a placement portion and a heat sink disposed under the placement portion, the light-emitting module is disposed on the placement portion, the light-emitting surface of each of the LEDs is toward the light transparent body, and the heat sink is provided with a recess for accommodating the second circuit board which is disposed under the first circuit board.

13. The separate LED lamp tube according to claim 10, wherein the electrical connection module is comprised of electrically conductive terminals and electrically conductive holes that are respectively disposed on the first and second circuit boards and are mutually insertable.

14. The separate LED lamp tube according to claim 10, wherein the driving module is provided with one to two of the second circuit boards, which are respectively assembled on the sides of the first circuit board by means of the electrical connection modules.

15. A light source module at least comprising:

at least one lamp tube, which is provided with a tube body, a light-emitting module and at least one driving module, wherein the tube body is provided with a light transparent body and a supporting body which are assembled with each other, a fastening means is disposed between the light transparent body and the supporting body, and the fastening means is a projection and a rail that are mutually engageable, and wherein the light-emitting module is disposed in the tube body and is provided with a first circuit board and a plurality of LEDs disposed on the first circuit board, and the at least one driving module is provided with a second circuit board and a drive circuit disposed on the second circuit board; and an electrical connection module, which comprises electrically conductive terminals and electrically conductive holes that are respectively disposed on the both ends of the at least one lamp tube, to provide cascade between the at least one lamp tube and another lamp tube or between the at least one lamp tube and at least one light emitting assembly.

16. The light source module according to claim 15, wherein an electrical connection module is further disposed between the first and second circuit boards and forms an electrical connection between the first and second circuit boards.

17. The light source module according to claim 15, wherein a driving module is provided at each of the opposite ends of the lamp tube.

18. The light source module according to claim 15, wherein the lamp tube is cascaded with the at least one light-emitting assembly by means of at least one electrical connection member and the light-emitting assembly is provided with a tube body and a light-emitting module.

19. The light source module according to claim 18, wherein the at least one electrical connection member is disposed outside the at least one lamp tube and the at least one light-emitting assembly.

20. The light source module according to claim 18, wherein the light-emitting module of the at least one lamp tube and the light-emitting module of the at least one light-emitting assembly are both driven by the drive circuit disposed on the second circuit board.

21. The light source module according to claim 15, wherein the electrically conductive terminals and the electrically conductive holes are formed toward different directions.

22. The light source module according to claim 17, wherein the electrically conductive terminals and the electrically conductive holes are respectively disposed on the at least one driving module and the another driving module.

* * * * *